(12) United States Patent
Hung et al.

(10) Patent No.: US 12,177,996 B2
(45) Date of Patent: Dec. 24, 2024

(54) SENSOR PACKAGE STRUCTURE

(71) Applicant: TONG HSING ELECTRONIC INDUSTRIES, LTD., Taipei (TW)

(72) Inventors: Li-Chun Hung, Hsin-Chu County (TW); Chien-Chen Lee, Hsin-Chu County (TW); Chia-Shuai Chang, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 187 days.

(21) Appl. No.: 18/113,723

(22) Filed: Feb. 24, 2023

(65) Prior Publication Data
US 2023/0397354 A1 Dec. 7, 2023

Related U.S. Application Data

(60) Provisional application No. 63/349,565, filed on Jun. 6, 2022.

(30) Foreign Application Priority Data

Dec. 29, 2022 (TW) .................................. 111150521

(51) Int. Cl.
*H05K 5/02* (2006.01)
*H01L 27/146* (2006.01)
*H05K 5/00* (2006.01)
*H05K 7/14* (2006.01)

(52) U.S. Cl.
CPC ..... *H05K 5/0247* (2013.01); *H01L 27/14618* (2013.01); *H01L 27/14636* (2013.01); *H05K 5/0091* (2013.01); *H05K 7/1417* (2013.01)

(58) Field of Classification Search
CPC .. H05K 5/0247; H05K 5/0091; H05K 7/1417; G01N 21/01; H01L 27/14618; H01L 27/14683; H01L 31/0203; G02B 5/0278; G02B 5/0221; H04N 23/54; H04N 23/55; H04N 25/60; H04N 25/61
See application file for complete search history.

(56) References Cited

U.S. PATENT DOCUMENTS

11,177,301 B2 * 11/2021 Tan ................... H01L 27/14683
11,901,384 B2 * 2/2024 Cho ....................... H04N 25/76
12,119,363 B2 * 10/2024 Lee ................... H01L 27/14625
(Continued)

*Primary Examiner* — Sagar Shrestha
(74) *Attorney, Agent, or Firm* — Li & Cai Intellectual Property (USA) Office (57) ABSTRACT

A sensor package structure is provided and includes a substrate, a sensor chip disposed on the substrate, a plurality of metal wires electrically coupling the substrate and the sensor chip, a frame fixed on the substrate, and a light-permeable layer that is disposed on the frame. The light-permeable layer has a transparent segment and a ring-shaped segment that surrounds the transparent segment. The ring-shaped segment is disposed on a top end surface of the frame, so that the light-permeable layer, the frame, and the substrate jointly define an enclosed space that accommodates the sensor chip and the metal wires therein. The ring-shaped segment has an inner ring-shaped roughened region that is arranged on an inner surface thereof and that is fixed onto the top end surface of the frame. Moreover, an inner edge of the inner ring-shaped roughened region is arranged in the enclosed space.

10 Claims, 8 Drawing Sheets

(56) References Cited

U.S. PATENT DOCUMENTS

| | | |
|---|---|---|
| 2007/0018309 A1 | 1/2007 | Chang et al. |
| 2008/0055729 A1 | 3/2008 | Li et al. |
| 2013/0271649 A1* | 10/2013 | Halliday ................ H04N 23/55 |
| | | 348/374 |
| 2019/0019834 A1* | 1/2019 | Tu ........................... H01L 24/49 |
| 2019/0057992 A1* | 2/2019 | Chen ................. H01L 27/14636 |
| 2020/0312897 A1* | 10/2020 | Hsieh ................ H01L 27/14618 |
| 2020/0373341 A1* | 11/2020 | Jo ........................... H01L 24/06 |
| 2022/0115426 A1* | 4/2022 | Son ........................ H04N 23/54 |
| 2022/0352227 A1* | 11/2022 | Otsuka ............. H01L 27/14623 |
| 2023/0073527 A1* | 3/2023 | Wang ................ H01L 27/14618 |
| 2023/0215896 A1* | 7/2023 | Lee .................. H01L 27/14618 |
| | | 257/666 |
| 2024/0030254 A1* | 1/2024 | Yun .................. H01L 27/14685 |

* cited by examiner

SENSOR PACKAGE STRUCTURE

CROSS-REFERENCE TO RELATED PATENT APPLICATION

This application claims the benefit of priority to Taiwan Patent Application No. 111150521, filed on Dec. 29, 2022. The entire content of the above identified application is incorporated herein by reference.

This application claims the benefit of priority to the U.S. Provisional Patent Application Ser. No. 63/349,565 filed on Jun. 6, 2022, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

In a conventional sensor package structure, light traveling onto a sensor chip by passing through a light-permeable layer is easily reflected to affect a sensing region of the sensor chip (e.g., by causing a flare phenomenon at the sensing region).

SUMMARY OF THE DISCLOSURE

In response to the above-referenced technical inadequacy, the present disclosure provides a sensor package structure to effectively improve on the issues associated with conventional sensor package structures.

In order to solve the above-mentioned problems, one of the technical aspects adopted by the present disclosure is to provide a sensor package structure, which includes a substrate, a sensor chip, a plurality of metal wires, a frame, and a light-permeable layer. The sensor chip is disposed on the substrate, and a top surface of the sensor chip includes a sensing region and a carrying region that surrounds the sensing region. Two ends of each of the metal wires are respectively connected to the substrate and the carrying region of the sensor chip to electrically couple the substrate and the sensor chip. The frame is fixed on the substrate, and the sensor chip and the metal wires are located in a space surroundingly defined by the frame. The light-permeable layer has an outer surface and an inner surface that is opposite to the outer surface. The light-permeable layer has a transparent segment and a ring-shaped segment that surrounds the transparent segment. The ring-shaped segment is disposed on the frame, so that the light-permeable layer, the frame, and the sensor chip jointly define an enclosed space. The ring-shaped segment has an inner ring-shaped roughened region, and wherein the inner ring-shaped roughened region is fixed to a top end surface of the frame, and an inner edge of the inner ring-shaped roughened region is located in the enclosed space.

Therefore, the sensor package structure in the present disclosure is provided with the inner ring-shaped roughened region formed on the inner surface of the light-permeable layer corresponding in position to the ring-shaped segment, so that light arriving on the inner ring-shaped roughened region by passing through the light-permeable layer can be scattered to prevent the light from being reflected to the sensing region through the metal wires, thereby effectively reducing the flare phenomenon of the sensor package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 5, a first embodiment of the present disclosure provides a sensor package structure 100. In other words, any package structure not encapsulating a sensor chip therein has a structural design different from that of the sensor package structure 100 of the present embodiment.

Figure 1:
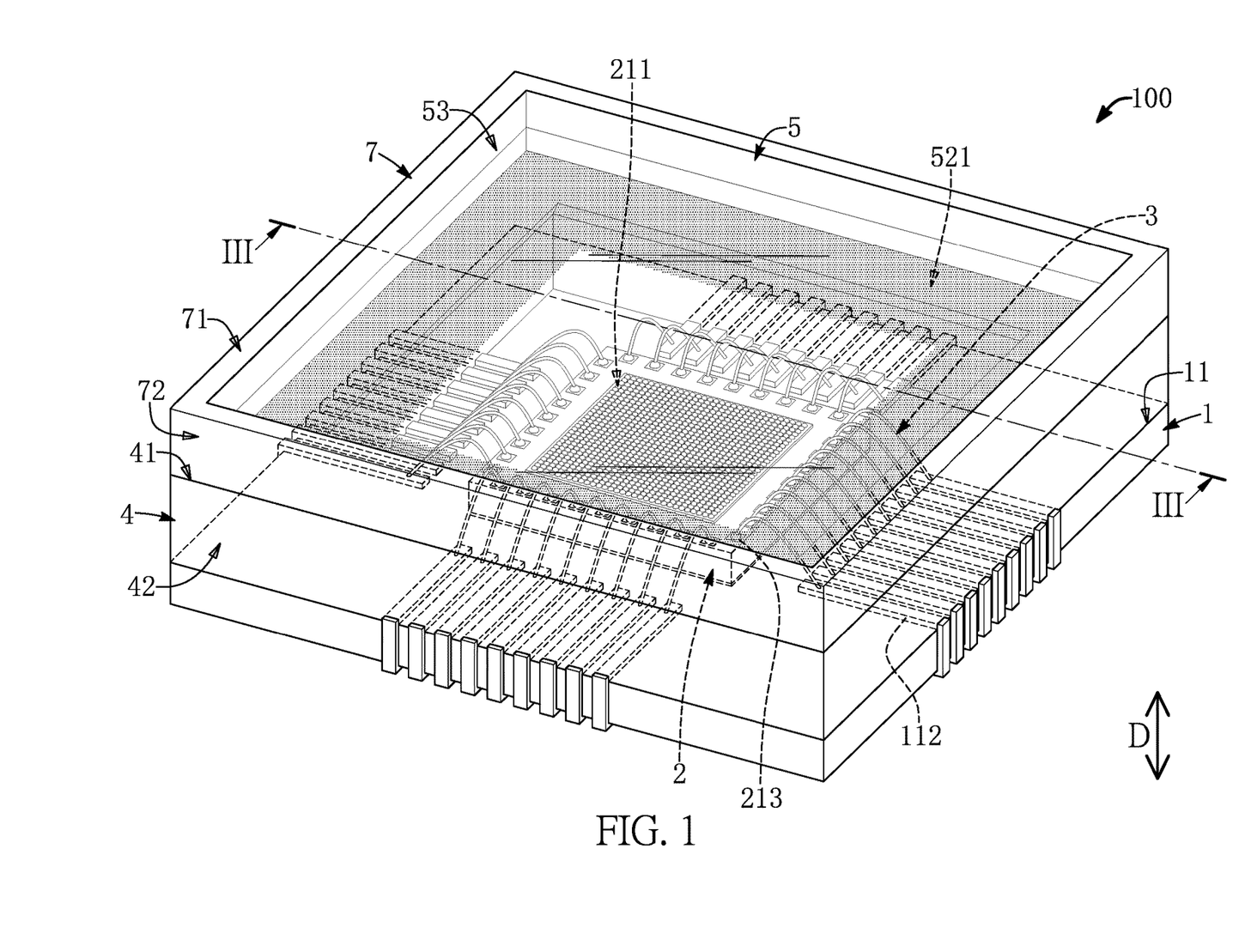
FIG. 1 is a schematic perspective view of a sensor package structure according to a first embodiment of the present disclosure.
Figure 2:
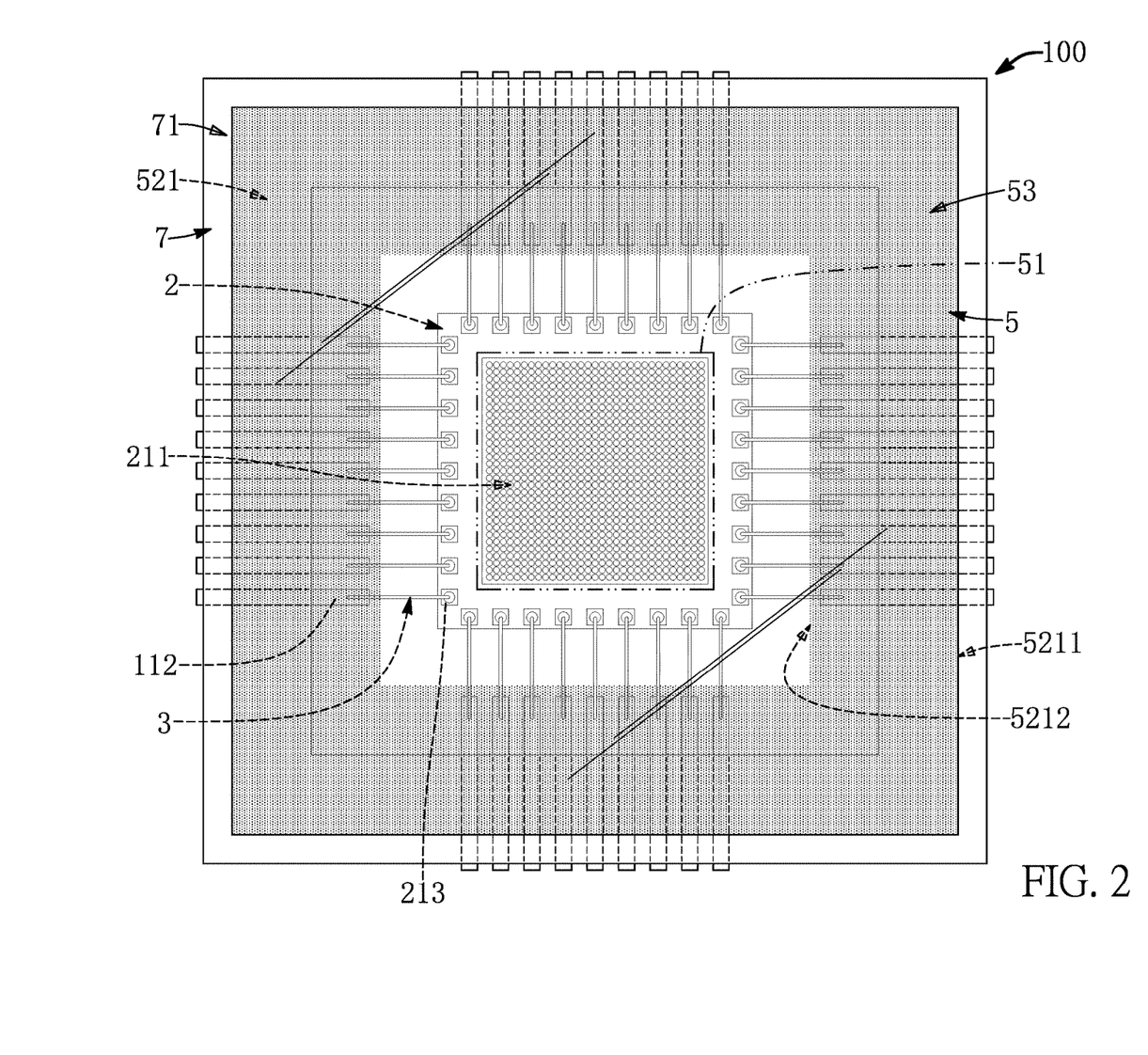
FIG. 2 is a top view of FIG. 1.
Figure 3:
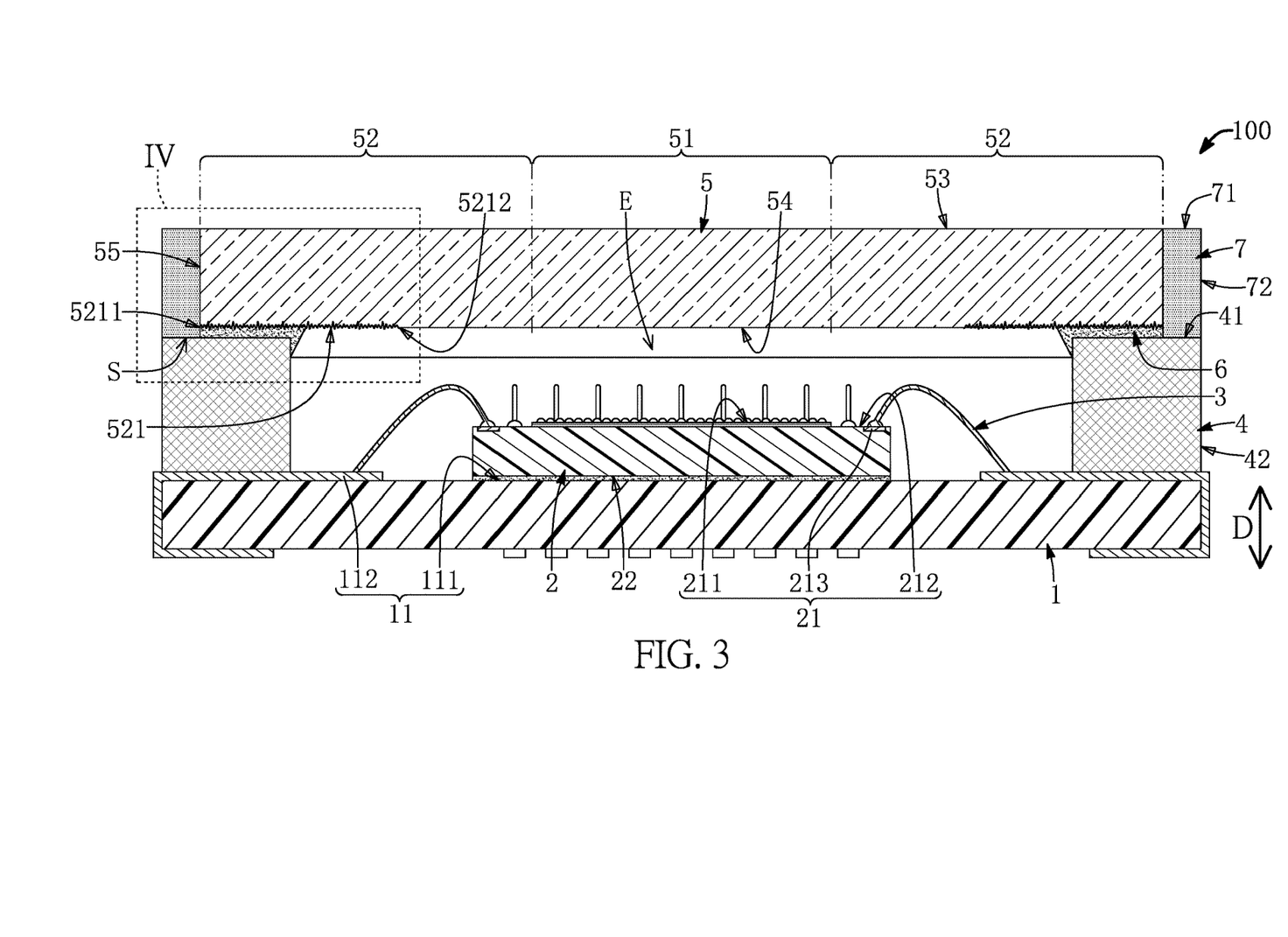
FIG. 3 is a cross-sectional view taken along line III-III of FIG. 1.
Figure 4:
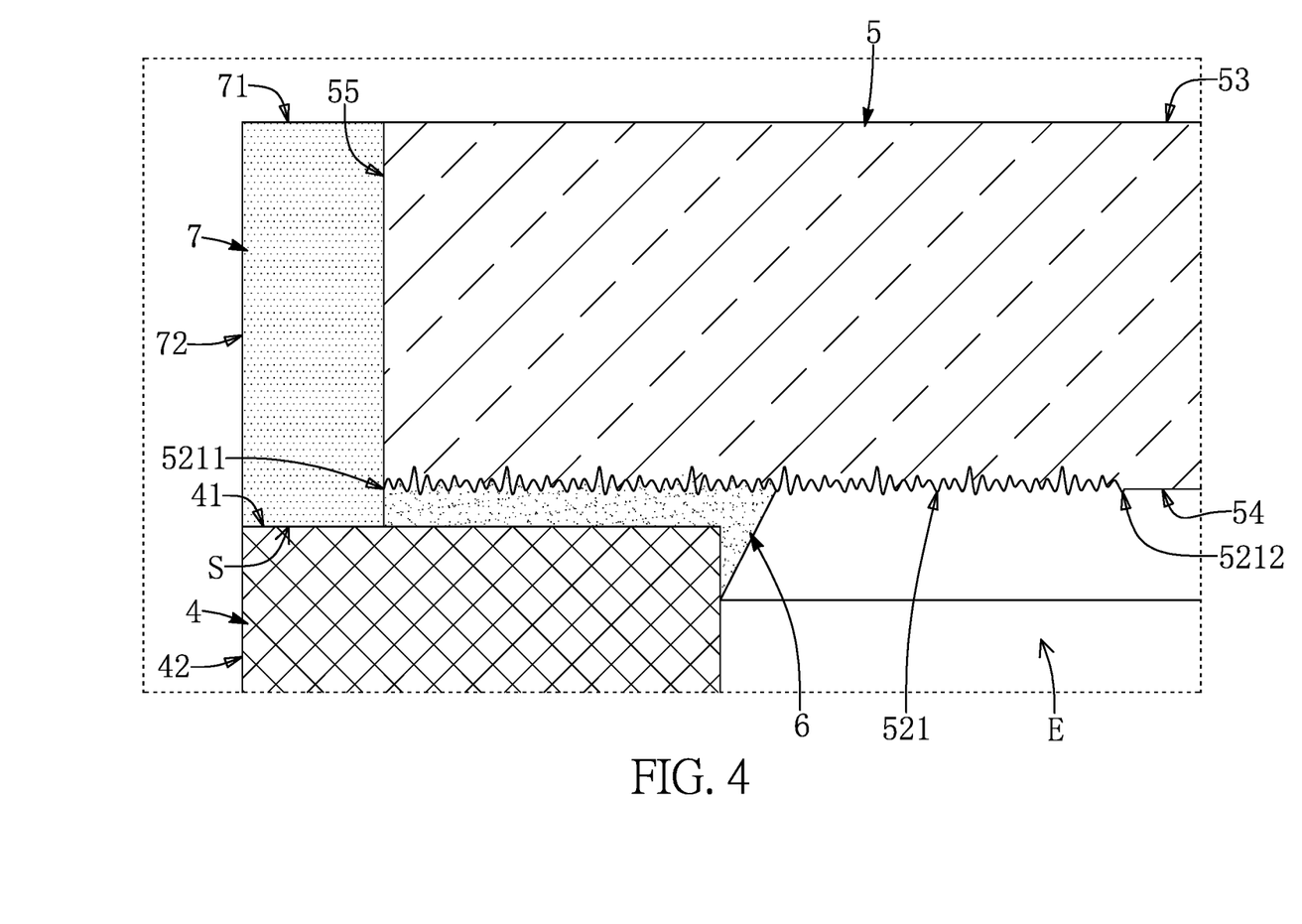
FIG. 4 is an enlarged view of part IV of FIG. 3.

As shown in FIG. 2 to FIG. 4, the sensor package structure 100 of the present embodiment includes a substrate 1, a sensor chip 2 disposed on the substrate 1, a plurality of metal wires 3 electrically coupled to the sensor chip 2 and the substrate 1, a frame 4 having a ring shape and being disposed on the substrate 1, a light-permeable layer 5 disposed on the frame 4, and an adhesive layer 6 adhered in-between the frame 4 and the light-permeable layer 5, and a sealing layer 7.

The sensor package structure 100 in the present embodiment includes the above components, but can be adjusted or changed according to design requirements. For example, in other embodiments of the present disclosure not shown in the drawings, the adhesive layer 6 and/or the sealing layer 7 of the sensor package structure 100 can be omitted or can be replaced by other components. The structure and connection relationship of each component of the sensor package structure 100 will be recited in the following description.

The substrate 1 of the present embodiment has a square shape or a rectangular shape, but the present disclosure is not limited thereto. An upper surface 11 of the substrate 1 includes a chip-bonding region 111 arranged approximately on a center portion thereof, and the substrate 1 includes a plurality of bonding pads 112 arranged outside of the chip-bonding region 111. The bonding pads 112 in the present embodiment are in a ring-shaped arrangement, but the present disclosure is not limited thereto. For example, in other embodiments of the present disclosure not shown in the drawings, the bonding pads 112 can be arranged in two rows respectively at two opposite sides of the chip-bonding region 111.

The sensor chip 2 in the present embodiment has a square shape or a rectangular shape, and is an image sensor chip, but the present disclosure is not limited thereto. A bottom surface 22 of the sensor chip 2 is fixed onto the chip-bonding region 111 of the substrate 1 (through a chip-bonding adhesive along a predetermined direction D). In other words, the sensor chip 2 is arranged to be surrounded on the inside of the bonding pads 112. Moreover, a top surface 21 of the sensor chip 2 has a sensing region 211 and a carrying region 212 that has a ring shape arranged around the sensing region 211. Two ends of each of the metal wires 3 are respectively connected to the substrate 1 and the carrying region 212 of the sensor chip 2, so that the substrate 1 and the sensor chip 2 are electrically coupled to each other.

Specifically, the sensor chip 2 includes a plurality of connection pads 213 arranged on the carrying region 212. In other words, the connection pads 213 are arranged outside of the sensing region 211. The number and positions of the connection pads 213 of the sensor chip 2 in the present embodiment correspond to those of the bonding pads 112 of the substrate 1. In other words, the connection pads 213 in the present embodiment are substantially in a ring-shaped arrangement. Moreover, the metal wires 3 are respectively connected to the bonding pads 112, and are also connected to the connection pads 213, respectively. In other words, the two ends of each of the metal wires 3 are respectively connected to one of the bonding pads 112 and the corresponding connection pad 213.

The frame 4 is adhered to a peripheral portion of the upper surface 11 of the substrate 1, and the sensor chip 2 and the metal wires 3 are located in a space surroundingly defined by the frame 4. In the present embodiment, the frame 4 adhered to the substrate 1 has a solid form. In other words, the frame 4 can be a structure made of a non-glue material, or can be formed by solidification of glue. Moreover, the frame 4 has a top end surface 41 being flat and an outer lateral surface 42 that is connected to the top end surface 41. The outer lateral surface 42 of the frame 4 is preferably flush with an outer edge of the substrate 1.

As shown in FIG. 2 to FIG. 4, the light-permeable layer 5 in the present embodiment is a transparent and flat glass board, but the present disclosure is not limited thereto. The light-permeable layer 5 has a transparent segment 51 and a ring-shaped segment 52 that surrounds the transparent segment 51. The light-permeable layer 5 is disposed on the top end surface 41 of the frame 4 through the ring-shaped segment 52, so that the light-permeable layer 5, the frame 4, and the substrate 1 jointly define an enclosed space E.

It should be noted that the shape and size of the transparent segment 51 in the present embodiment substantially correspond to those of the sensing region 211; in other words, a projection region defined by orthogonally projecting the transparent segment 51 onto the top surface 21 of the sensor chip 2 along the predetermined direction D is substantially overlapped with an entirety of the sensing region 211, but the present disclosure is not limited thereto. For example, in other embodiments of the present disclosure not shown in the drawings, the size of the transparent segment 51 can be slightly greater than that of the sensing region 211.

Specifically, the light-permeable layer 5 has an outer surface 53, an inner surface 54 that is opposite to the outer surface 53, and a surrounding lateral surface 55 that is connected to the outer surface 53 and the inner surface 54. The ring-shaped segment 52 has a ring-shaped roughened region 521 formed on the inner surface 54 (i.e., a part of the inner surface 54 on the ring-shaped segment 52). The inner ring-shaped roughened region 521 is fixed to the top end surface 41 of the frame 4 (e.g., the adhesive layer 6 is gaplessly connected in-between the inner ring-shaped roughened region 521 and the top end surface 41 of the frame 4), an inner edge 5212 of the inner ring-shaped roughened region 521 is located in the enclosed space E, and an outer edge 5211 of the inner ring-shaped roughened region 521 is preferably arranged on an outer edge of the inner surface 54 of the light-permeable layer 5.

Specifically, positions of the inner edge 5212 and the outer edge 5211 of the inner ring-shaped roughened region 521 can be adjusted or changed according to design requirements. For example, as shown in FIG. 3 and FIG. 4, the inner edge 5212 of the inner ring-shaped roughened region 521 can be arranged close to the frame 4, and a projection space defined by orthogonally projecting the inner ring-shaped roughened region 521 toward the substrate 1 covers each of the bonding pads 112 and a part of each of the metal wires 3.

Figure 5:
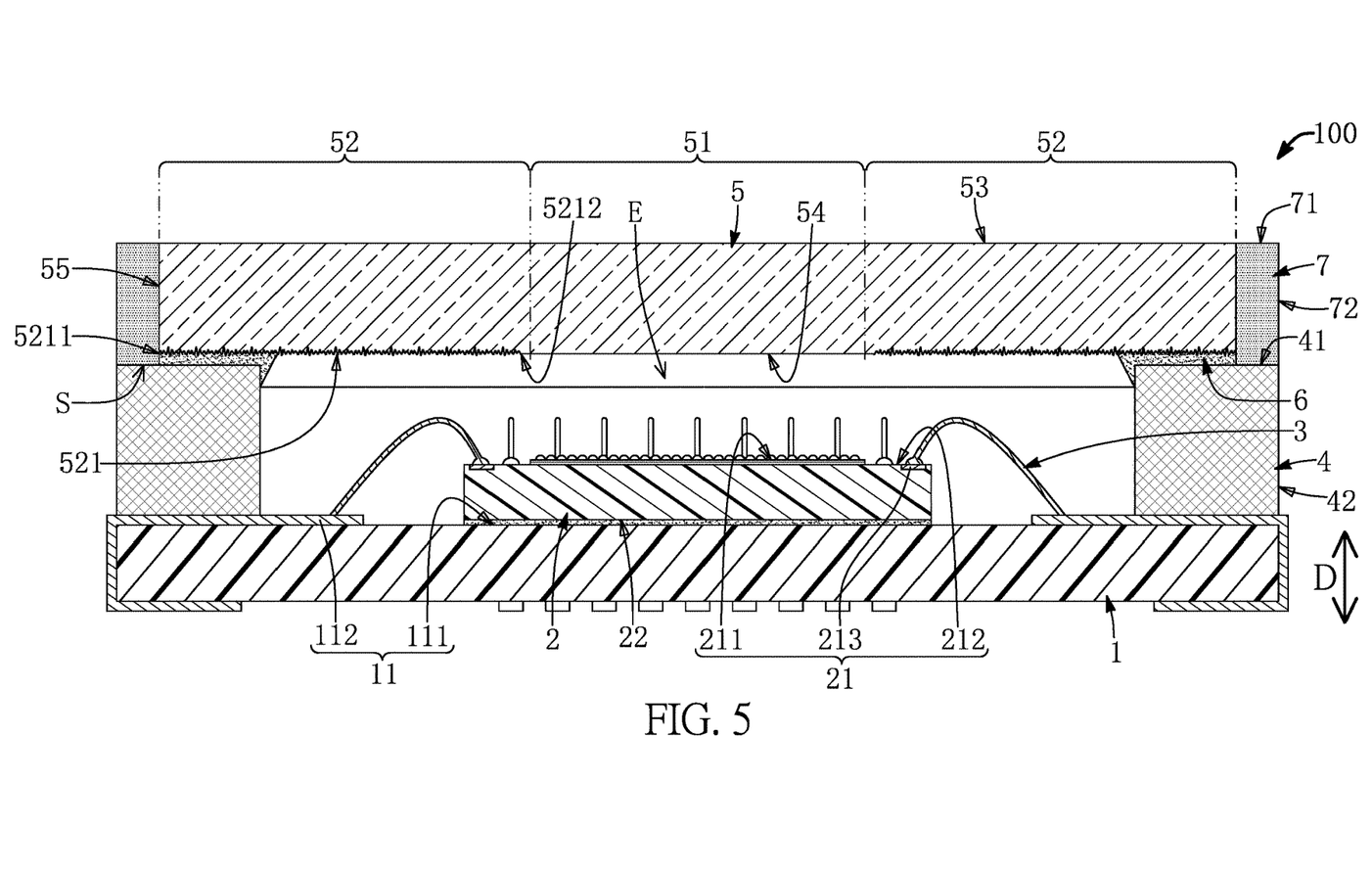
FIG. 5 is a cross-sectional view showing the sensor package structure in another configuration according to the first embodiment of the present disclosure.

Or, as shown in FIG. 5, the inner edge 5212 of the inner ring-shaped roughened region 521 can be arranged close to the transparent segment 51, and the projection space covers each of the bonding pads 112, each of the connection pads 213, and each of the metal wires 3. In addition, in other embodiments of the present disclosure not shown in the drawings, the outer edge 5211 of the inner ring-shaped roughened region 521 can be arranged apart from the outer edge of the inner surface 54 of the light-permeable layer 5 by a distance.

In summary, the sensor package structure 100 in the present embodiment is provided with the inner ring-shaped roughened region 521 formed on the inner surface 54 of the light-permeable layer 5 corresponding in position to the ring-shaped segment 52, so that light arriving on the inner ring-shaped roughened region 521 by passing through the light-permeable layer 5 can be scattered to prevent the light from being reflected to the sensing region 211 through the metal wires 3, thereby effectively reducing the flare phenomenon of the sensor package structure 100.

Moreover, the inner ring-shaped roughened region 521 has a haze being within a range from 10% to 90%. The haze of the inner ring-shaped roughened region 521 is preferably within a range from 30% to 90%, but the present disclosure is not limited thereto. In addition, the inner ring-shaped roughened region 521 can have an irregular pattern or a regular pattern (not shown in the drawings) according to design requirements.

Specifically, the surrounding lateral surface 55 of the light-permeable layer 5 is arranged inside of the outer lateral surface 42 of the frame 4 by a distance (e.g., the size of the light-permeable layer 5 is smaller than that of the frame 4), so that the surrounding lateral surface 55 and the top end surface 41 of the frame 4 are jointly formed as a step-like structure S.

Furthermore, the sealing layer 7 of the present embodiment is a mold resin, but the present disclosure is not limited thereto. The sealing layer 7 is formed on the step-like structure S and is adhered to the surrounding lateral surface 55 of the light-permeable layer 5 and the top end surface 41 of the frame 4, and the sealing layer 7 is adhered to an outer edge of the adhesive layer 6. In the present embodiment, a top side 71 of the sealing layer 7 is flush with the outer surface 53 of the light-permeable layer 5, and an outer lateral side 72 of the sealing layer 7 is flush with the outer lateral surface 42 of the frame 4.

In addition, the sealing layer 7 and the adhesive layer 6 in the present embodiment are individual components made of two different materials that are connected to each other, but the present disclosure is not limited thereto. For example, in other embodiments of the present disclosure not shown in the drawings, the sealing layer 7 and the adhesive layer 6 can be of the same material or can be integrally formed as a single one-piece structure.

Second Embodiment

Figure 6:
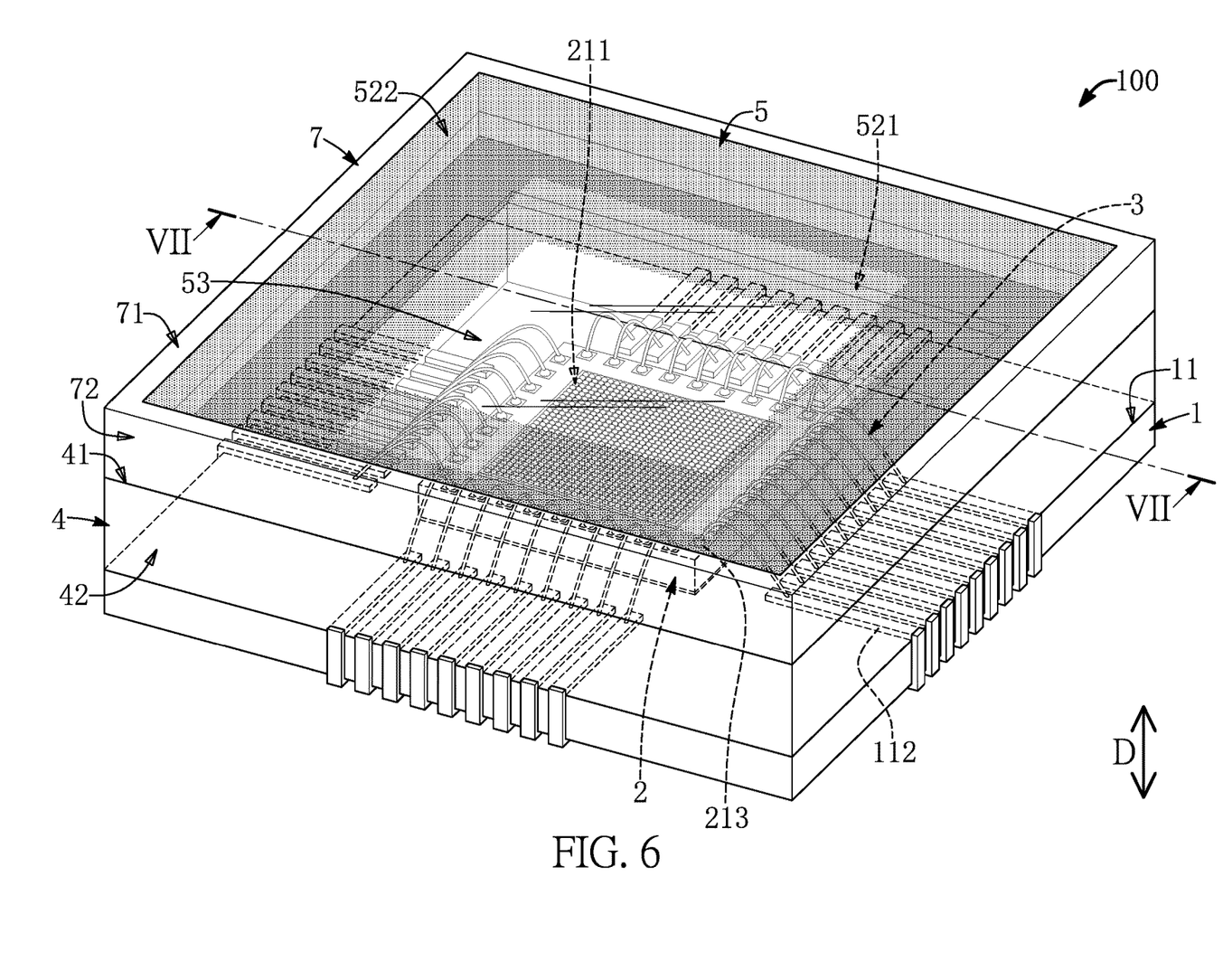
FIG. 6 is a schematic perspective view of the sensor package structure according to a second embodiment of the present disclosure.
Figure 7:
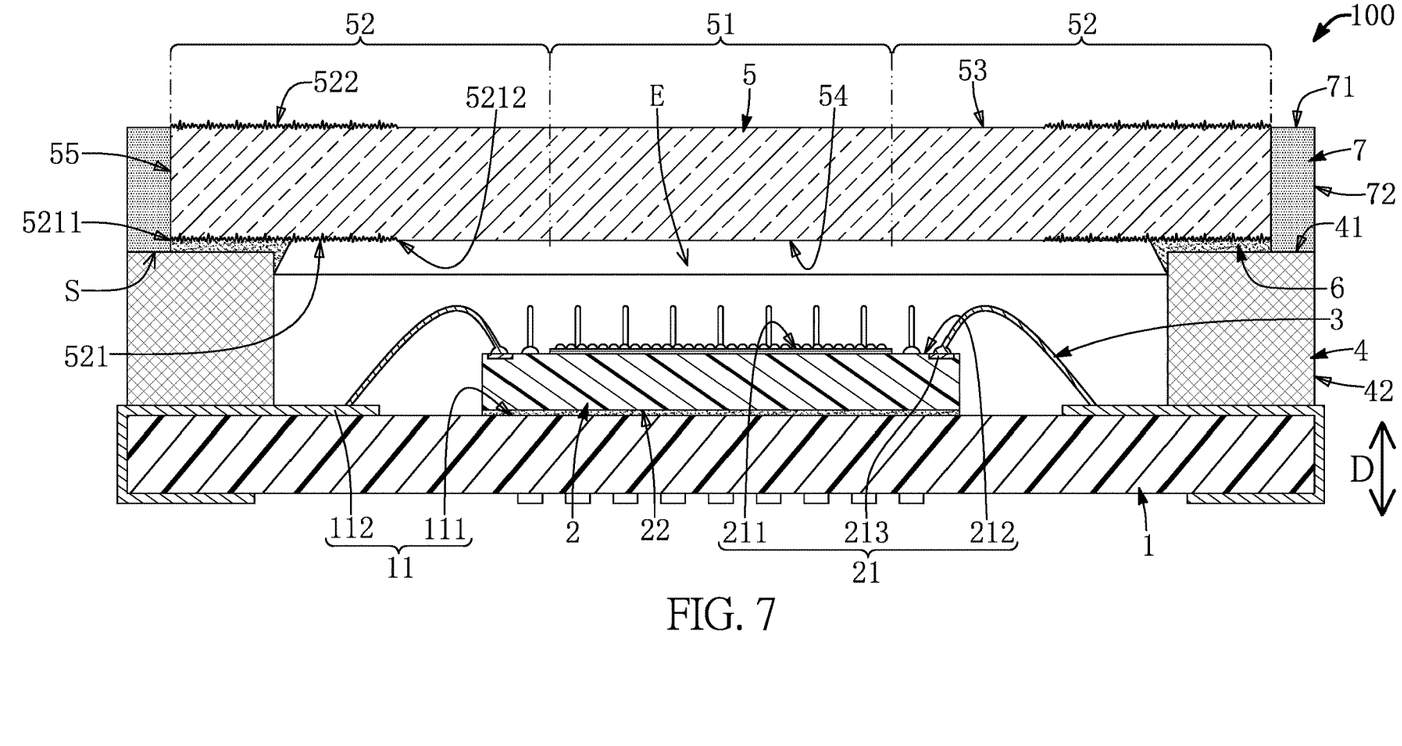
FIG. 7 is a cross-sectional view taken along line VII-VII of FIG. 6.
Figure 8:
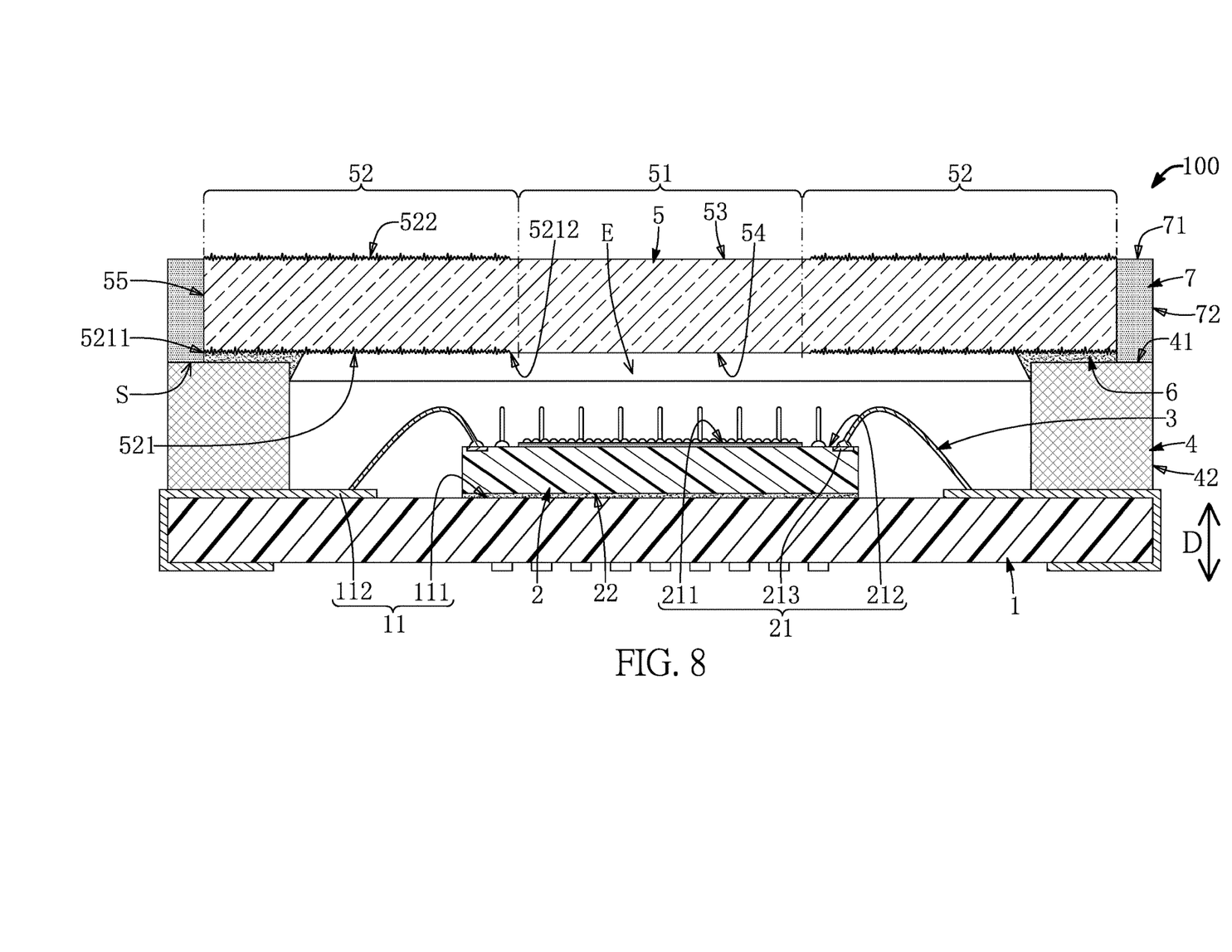
FIG. 8 is a cross-sectional view showing the sensor package structure in another configuration according to the second embodiment of the present disclosure.

Referring to FIG. 6 to FIG. 8, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the ring-shaped segment 52 has an outer ring-shaped roughened region 522 formed on the outer surface 53, and the outer ring-shaped roughened region 522 has a haze being within a range from 10% to 90%. The haze of the outer ring-shaped roughened region 522 is preferably within a range from 30% to 90%, but the present disclosure is not limited thereto. In addition, the outer ring-shaped roughened region 522 can have an irregular pattern or a regular pattern (not shown in the drawings) according to design requirements.

Moreover, a projection region defined by orthogonally projecting the outer ring-shaped roughened region 522 onto the inner surface 54 of the light-permeable layer 5 along the predetermined direction D is overlapped with at least part of the inner ring-shaped roughened region 521. In other words, light can arrive on the inner ring-shaped roughened region 521 after the light is scattered through the outer ring-shaped roughened region 522, thereby further reducing the flare phenomenon of the sensor package structure 100.

Beneficial Effects of the Embodiments

In conclusion, the sensor package structure in the present disclosure is provided with the inner ring-shaped roughened region formed on the inner surface of the light-permeable layer corresponding in position to the ring-shaped segment, so that light arriving on the inner ring-shaped roughened region by passing through the light-permeable layer can be scattered to prevent the light from being reflected to the sensing region through the metal wires, thereby effectively reducing the flare phenomenon of the sensor package structure.

Moreover, the ring-shaped segment of the sensor package structure in the present disclosure can be provided by further forming the outer ring-shaped roughened region on the outer surface, so that light can arrive on the inner ring-shaped roughened region after the light is scattered through the outer ring-shaped roughened region, thereby further reducing the flare phenomenon of the sensor package structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
   a substrate;
   a sensor chip disposed on the substrate, wherein a top surface of the sensor chip includes a sensing region and a carrying region that surrounds the sensing region;
   a plurality of metal wires each having two ends respectively connected to the substrate and the carrying region of the sensor chip to electrically couple the substrate and the sensor chip;
   a frame fixed on the substrate, wherein the sensor chip and the metal wires are located in a space surroundingly defined by the frame; and
   a light-permeable layer having an outer surface and an inner surface that is opposite to the outer surface, wherein the light-permeable layer has a transparent segment and a ring-shaped segment that surrounds the transparent segment, and wherein the ring-shaped segment is disposed on the frame, so that the light-permeable layer, the frame, and the sensor chip jointly define an enclosed space;

wherein the ring-shaped segment has an inner ring-shaped roughened region, and wherein the inner ring-shaped roughened region is fixed to a top end surface of the frame, and an inner edge of the inner ring-shaped roughened region is located in the enclosed space.

2. The sensor package structure according to claim 1, wherein the inner ring-shaped roughened region has a haze being within a range from 10% to 90%.

3. The sensor package structure according to claim 1, wherein the substrate includes a plurality of bonding pads respectively connected to the metal wires, and a projection space defined by orthogonally projecting the inner ring-shaped roughened region toward the substrate covers each of the bonding pads and at least part of each of the metal wires.

4. The sensor package structure according to claim 1, wherein the substrate includes a plurality of bonding pads respectively connected to the metal wires, the sensor chip includes a plurality of connection pads arranged on the carrying region and respectively connected to the metal wires, and a projection space defined by orthogonally projecting the inner ring-shaped roughened region toward the substrate covers each of the bonding pads, each of the connection pads, and each of the metal wires.

5. The sensor package structure according to claim 1, wherein an outer edge of the inner ring-shaped roughened region is arranged on an outer edge of the inner surface of the light-permeable layer.

6. The sensor package structure according to claim 1, wherein the top end surface of the frame is flat, and the sensor package structure further includes an adhesive layer gaplessly connected in-between the inner ring-shaped roughened region and the top end surface of the frame.

7. The sensor package structure according to claim 1, wherein an outer lateral surface of the frame is flush with an outer edge of the substrate, and the light-permeable layer has a surrounding lateral surface connected to the inner surface and the outer surface, and wherein the surrounding lateral surface is arranged inside of the outer lateral surface of the frame by a distance, so that the surrounding lateral surface and the top end surface of the frame are jointly formed as a step-like structure.

8. The sensor package structure according to claim 7, further comprising a sealing layer, wherein the sealing layer is formed on the step-like configuration and is adhered to the surrounding lateral surface of the light-permeable layer and the top end surface of the frame, and the sealing layer is adhered to an outer edge of the adhesive layer.

9. The sensor package structure according to claim 8, wherein a top side of the sealing layer is flush with the outer surface of the light-permeable layer, and an outer lateral side of the sealing layer is flush with the outer lateral surface of the frame.

10. The sensor package structure according to claim 1, wherein the ring-shaped segment has an outer ring-shaped roughened region formed on the outer surface, and the outer ring-shaped roughened region has a haze being within a range from 10% to 90%.

* * * * *